United States Patent
Liu et al.

(10) Patent No.: US 12,022,639 B2
(45) Date of Patent: Jun. 25, 2024

(54) INDUCED AIR CONVECTION COOLING FOR COMPUTING OR NETWORKING DEVICES

(71) Applicant: Cisco Technology, Inc., San Jose, CA (US)

(72) Inventors: Chejung Liu, San Jose, CA (US); Vic Hong Chia, Sunnyvale, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 181 days.

(21) Appl. No.: 17/670,608

(22) Filed: Feb. 14, 2022

(65) Prior Publication Data
US 2023/0262938 A1 Aug. 17, 2023

(51) Int. Cl.
*H05K 7/20* (2006.01)
*H05K 1/02* (2006.01)

(52) U.S. Cl.
CPC ....... *H05K 7/20409* (2013.01); *H05K 1/0203* (2013.01)

(58) Field of Classification Search
CPC ............. H05K 7/20409; H05K 1/0203; H05K 1/0272; H05K 7/20209; H05K 5/0047; H05K 5/0052; H05K 7/20127; H05K 7/20245; H05K 7/20545
See application file for complete search history.

(56) References Cited

U.S. PATENT DOCUMENTS

| | | | |
|---|---|---|---|
| 6,650,538 B1 | 11/2003 | Chu et al. | |
| 7,457,133 B2 * | 11/2008 | Chiang | H05K 7/20127 361/800 |
| 7,843,691 B2 * | 11/2010 | Reichert | G06F 1/203 165/104.33 |
| 9,285,846 B2 * | 3/2016 | Degner | H05K 7/20009 |
| 9,332,676 B2 * | 5/2016 | Sharaf | H05K 7/20927 |
| 9,756,760 B2 * | 9/2017 | Dangy-Caye | H05K 7/20145 |
| 2006/0104025 A1 * | 5/2006 | Wabiszczewicz | H05K 7/20154 361/694 |
| 2006/0215364 A1 | 9/2006 | Le | |
| 2013/0145612 A1 | 6/2013 | Busch et al. | |
| 2019/0357388 A1 | 11/2019 | Sato | |
| 2021/0092871 A1 | 3/2021 | Hur et al. | |

* cited by examiner

*Primary Examiner* — Jayprakash N Gandhi
*Assistant Examiner* — Sara Amanda Comer
(74) *Attorney, Agent, or Firm* — Edell, Shapiro & Finnan, LLC (57) ABSTRACT

An apparatus comprising a printed circuit board with at least one heat source, an enclosure around the printed circuit board, wherein the enclosure includes a first surface and a second surface opposite the first surface, and a heatsink comprising a body portion and a plurality of fins extending from the body portion, wherein the heatsink is attached to the first surface, and wherein the at least one heat source conducts heat to the heatsink, wherein a plurality of channels are provided between the first surface and the second surface, each of the plurality of channel passing through the enclosure, the heatsink, and the printed circuit board.

20 Claims, 9 Drawing Sheets

INDUCED AIR CONVECTION COOLING FOR COMPUTING OR NETWORKING DEVICES

TECHNICAL FIELD

The present disclosure relates to cooling computing and/or networking devices, and more specifically, to passively-induced air cooling of computing or networking devices.

BACKGROUND

The operation of electronic devices, such as computing or networking devices, often generates heat that needs to be dissipated in order to avoid potential damage to, or negative performance impact of, physical components such as processors or memory. Conventional approaches to cooling typically employ technologies such as heatsinks to allow heat to be conducted away from hardware components. Additionally or alternatively, fluids may be circulated in order to cool components, such as air or other liquid cooling approaches. However, circulation of fluids typically requires moving parts, which can be prone to breaking, can cause noise, and can increase costs to install and/or maintain.

DESCRIPTION OF EXAMPLE EMBODIMENTS

Overview

Briefly, in one embodiment, an apparatus is provided comprising a printed circuit board with at least one heat source, an enclosure around the printed circuit board, wherein the enclosure includes a first surface and a second surface opposite the first surface, and a heatsink comprising a body portion and a plurality of fins extending from the body portion. The heatsink is attached to the first surface, and the at least one heat source conducts heat to the heatsink. A plurality of channels are provided between the first surface and the second surface, and each of the plurality of channels passing through the enclosure, the heatsink, and the printed circuit board.

Example Embodiments

The present disclosure relates to cooling of computing and/or networking devices, and more specifically, to passively-induced air cooling of computing or networking devices. Some computing and/or networking devices, such as Internet-of-Things devices, switches, and the like, may rely on free convection to dissipate heat from the internal heat-generating sources (e.g., processors, application-specific integrated circuits, etc.). Free convection cooling techniques rely on the efficiency of thermal conduction to a device's enclosure surface, at which point the heat may convect and radiate from the surface skin of the enclosure. In general, a larger surface area increases the heat transfer rate, so heatsinks typically have numerous fins to increase the surface area.

However, some components of devices may consume an amount of power that results in the generation of an amount of heat that cannot be dissipated via passive cooling alone. For example, newer devices may consume 40% or more power while being implemented into an enclosure whose size has not changed. Additionally or alternatively, devices may not be able to passively cool themselves when installed in particular settings, such as the underside of a desk or directly underneath a ceiling, the latter of which being a frequent installation site for wireless networking devices. Because warm air rises, a device that is installed underneath a structure may heat the air around it, causing the air to be trapped by the structure; this warm air then stagnates and is warmed further, and the device may overheat.

Accordingly, present embodiments achieve passive (e.g., fanless) cooling for computing and/or networking devices by providing one or more channels that pass through the entirety of the device's enclosure (and potentially any intervening internal components) to enable air flow from one side of the device to another side of the device. Thus, when the sides of a device are unevenly warmed (e.g., by positioning a heatsink on one side of the device), air can pass through the device itself, thereby passively inducing a current of air from a warmer side to the cooler side (as hot air rises). In particular, since warmer air is less dense than cooler air, a volume of hot air will rise; accordingly, when a device is installed such that a warmer side is lower than a cooler side, air will naturally circulate through the channels, thereby preventing warm air from stagnating around the warmer side. As the warmer air rises, it is replaced by cooler air, thereby increasing the efficiency of a heatsink that may be positioned on the warmer side. Thus, heat can be irradiated from a device, warming the surrounding fluid (e.g., air), which convects the heat away as the fluid is circulated passively.

Present embodiments thereby achieve more efficient cooling of devices without requiring fans or other mechanical approaches for circulating or pumping cooling fluids, thereby decreasing the power consumption of devices, while also avoiding any mechanical-type failures that are more likely whenever moving parts are involved. Accordingly, for a 10 Watt (W) device operating in 50° C. ambient air, for example, present embodiments can achieve a reduction in both skin temperature of the enclosure, and integrated circuit temperature, of several degrees Celsius or more by increasing the flow rate by 10% or more. Accordingly, present embodiments more effectively cool devices in an economical way that does not involve any exotic and/or expensive components, moving parts, and the like.

It should be noted that references throughout this specification to features, advantages, or similar language herein do not imply that all of the features and advantages that may be realized with the embodiments disclosed herein should be, or are in, any single embodiment. Rather, language referring to the features and advantages is understood to mean that a specific feature, advantage, or characteristic described in connection with an embodiment is included in at least one embodiment. Thus, discussion of the features, advantages, and similar language, throughout this specification may, but do not necessarily, refer to the same embodiment.

Furthermore, the described features, advantages, and characteristics may be combined in any suitable manner in one or more embodiments. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages will become more fully apparent from the following drawings, description and appended claims, or may be learned by the practice of embodiments as set forth hereinafter.

Figure 1:
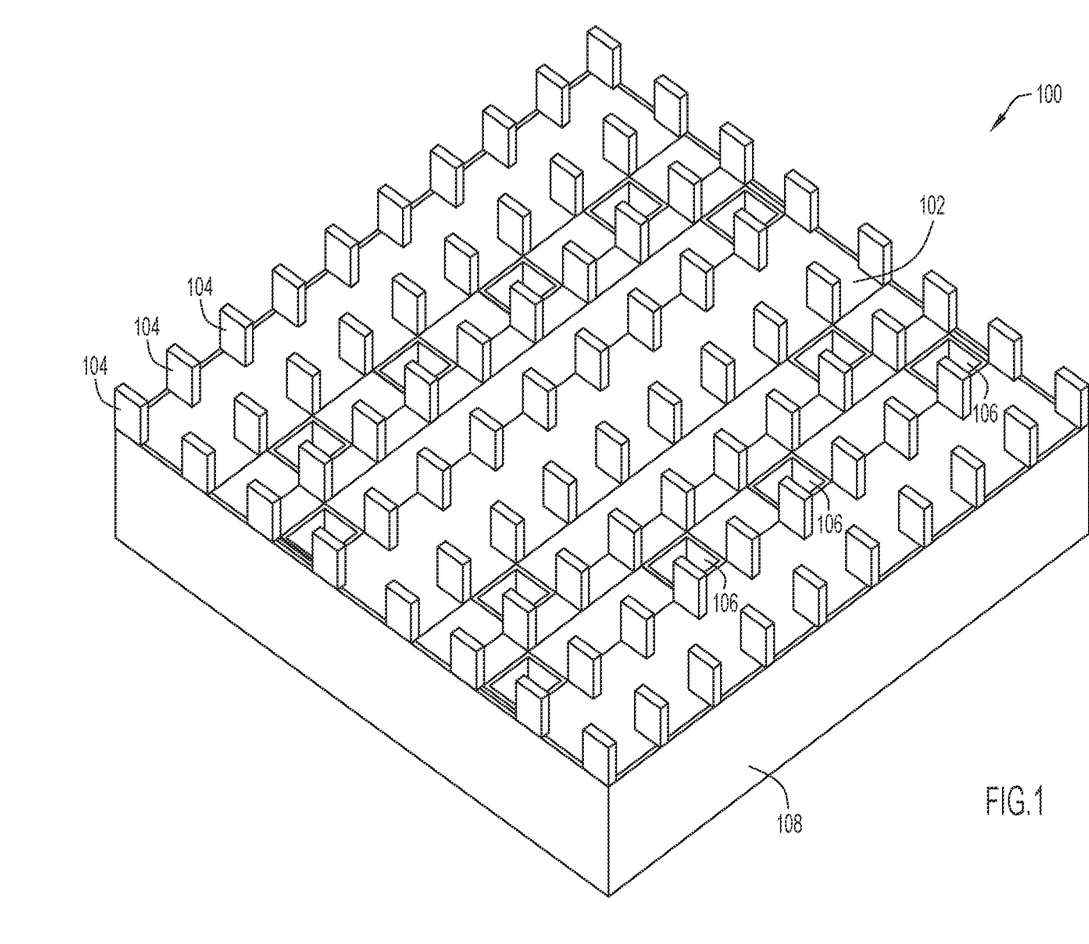
FIG. 1 is a top perspective view of an enclosure for an electronic device, such as a computing or networking device, according to an example embodiment.

Embodiments will now be described in detail with reference to the Figures. FIG. 1 is a top perspective view of an enclosure 100 for an electronic device, such as a computing or networking device, according to an example embodiment. As depicted, enclosure 100 includes a heat sink surface 102 from which a plurality of fins 104 extend. A plurality of channels 106 pass through the entirety of enclosure 100; it should be appreciated that the number and location of fins 104 and/or channels 106 may differ in various embodiments to achieve any desired goal of heat dissipation, cost savings, accommodation of internal components, and the like. Enclosure 100 also includes side surface 108, which together with heat sink surface 102 and a second surface (reverse surface 110, depicted and described in further detail with respect to FIG. 2), forms a three-dimensional shape that is substantially a square prism or cube. However, it should be appreciated that enclosure 100 may be any three-dimensional shape in order to accommodate internal computing and/or networking components or for other design reasons. For example, enclosure 100 may be a polygonal prism, an isohedron, an irregular shape, etc. In various embodiments, fins 104 may be any length, including variable lengths in a single embodiment (e.g., some fins may be longer than other fins). Additionally or alternatively, some embodiments may exclude fins 104 from a portion or all of enclosure 100 (e.g., to provide a substantially finless embodiment).

Figure 2:
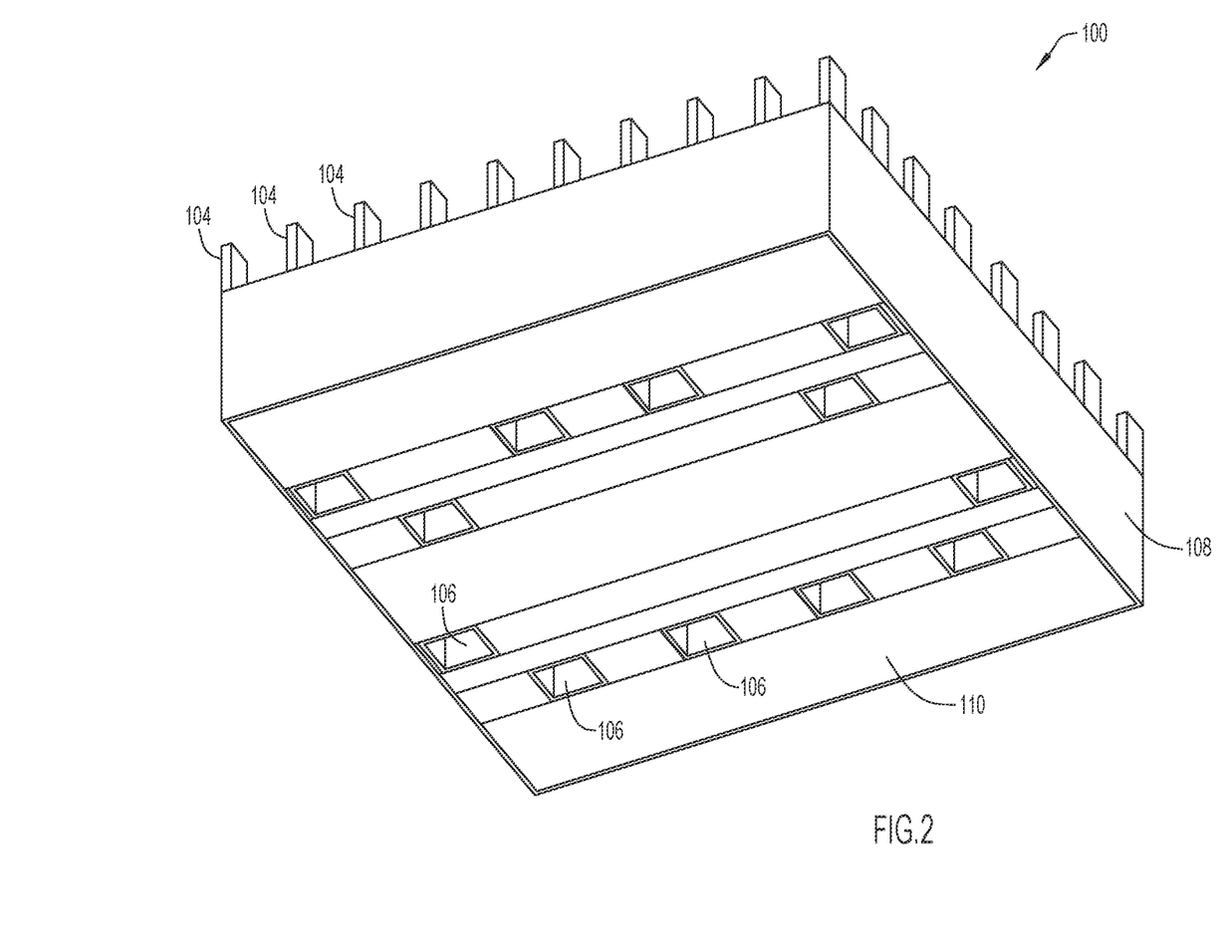
FIG. 2 is a bottom perspective view of an enclosure for a computing or networking device, according to an example embodiment.

FIG. 2 is a bottom perspective view of an enclosure 100 for a computing or networking device, according to an example embodiment. The embodiment of enclosure 100 depicted in FIG. 2 may correspond to the same embodiment of enclosure 100 that is depicted and described with regard to FIG. 1, or may correspond to other embodiments.

As depicted in FIG. 2, enclosure 100 includes a plurality of fins 104, a plurality of channels 106 passing through the entirety of enclosure 100, side surface 108, and reverse surface 110, which may be provided to substantially or fully enclose an internal cavity inside of enclosure 100 from the external environment. Accordingly, enclosure 100 can contain internal components that can perform networking and/or computing tasks while not being exposed to the external environment, thereby preventing dust from accumulating on internal components, preventing exposure of internal components to electromagnetic radiation, and the like.

In some embodiments, the entirety of enclosure 100 acts as a heat sink, as the material that constitutes enclosure 100 and heat sink surface 102 may be a same or different conducting material. In one embodiment, the material of enclosure 100 and/or heat sink surface 102 includes an aluminum material, such as Al 6061, which may be provided with a polished surface treatment.

Figure 3:
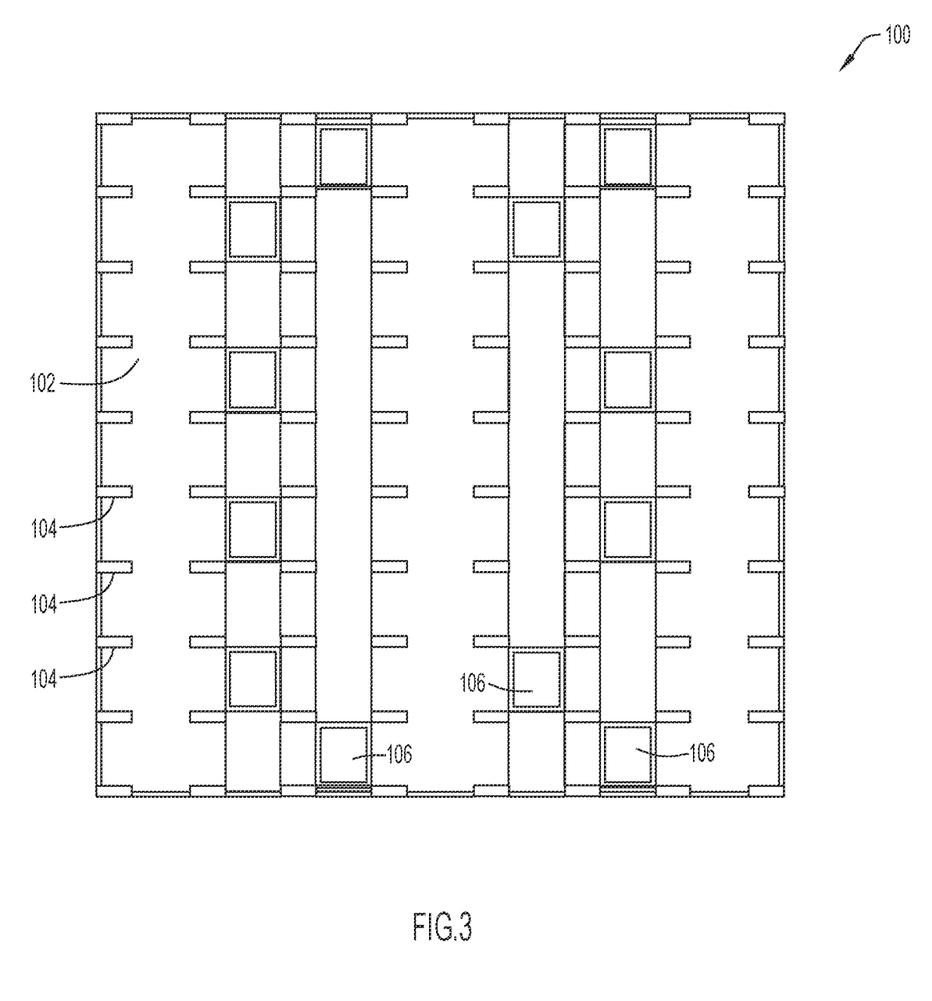
FIG. 3 is a top view of an enclosure for a computing or networking device, according to an example embodiment.

FIG. 3 is a top view of an enclosure 100 for a computing or networking device, according to an example embodiment. As depicted, enclosure 100 includes a heat sink surface 102, a plurality of fins 104, and a plurality of channels 106. Each channel of the plurality of channels 106 may have an interior channel surface that extends from heat sink surface 102 and runs the length of each channel to the opposite surface of enclosure 100 (e.g., reverse surface 110). Accordingly, while air (or other fluids) may pass through channels 106, the air of the external environment is substantially prevented from entering an interior cavity of enclosure 100.

The positioning and/or count of fins 104 and/or channels 106 may differ in various embodiments. In some embodiments, a number of channels 106 may be optimized to maximize the number of channels 106 while not interfering with internal components and/or the flow of any air (or other fluids) that may be sealed or otherwise contained within enclosure 100. In some embodiments, channels 106 are arranged such that channels 106 are more densely provided in locations nearer the heat source (e.g., a processor). In the depicted example, the cross-sectional shape of each channel 106 is substantially square-shaped. However, in various other embodiments, channels 106 may have cross-sectional shapes that correspond to any desired regular or irregular shape, such as a circle, oval, pentagon, and the like. Each channel 106 may not have the same cross-sectional shape as other channels, and in some embodiments a variety of different channel cross-sectional shapes may be provided in a single enclosure 100. Channels 106 may be provided at positions in which the gap introduced by each channel either avoids internal components, or passes through internal components at non-essential positions of those internal components. For example, a printed circuit board (PCB) may have some areas with no circuitry, and a gap can be provided at those points that permits a channel 106 to pass through the PCB. The passage of channels through components is depicted and described in further detail with regard to FIGS. 6A and 6B.

Figure 4:
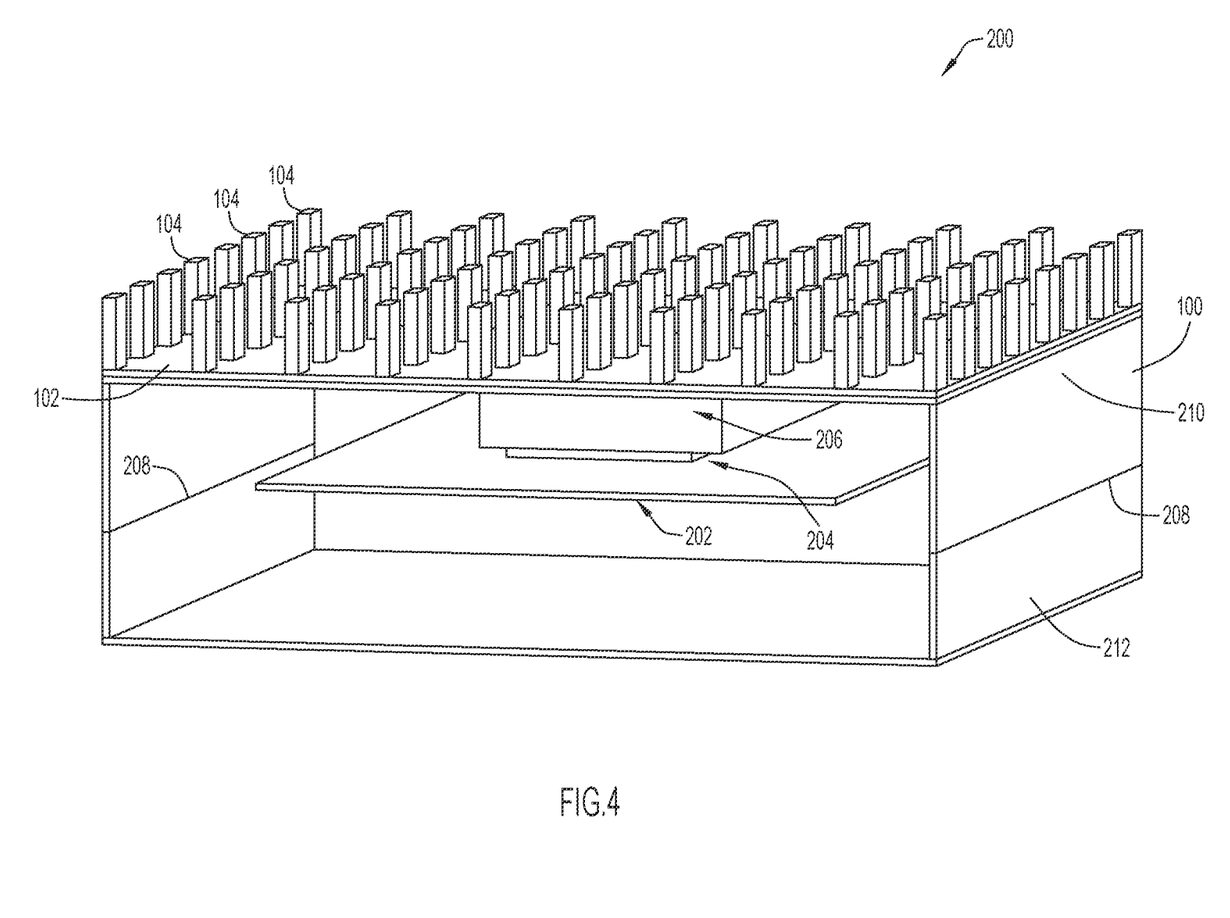
FIG. 4 is a cutaway view of an assembly including an enclosure and internal components, according to an example embodiment.

FIG. 4 is a cutaway view of an assembly 200 including an enclosure 100 and internal components, according to an example embodiment. The internal components may include a PCB 202, a heat source 204 (e.g., a processor), and a heat sink base 206. In the depicted example, channels 106 are not shown for the purpose of clarity; however, it should be understood that in accordance with various embodiments, channels may be provided that pass through portions of enclosure 100, including portions of components such as PCB 202. Enclosure 100 may be a clamshell enclosure that is an assembly of two portions that come together at a joining location, as shown by joint 208.

PCB 202 may include any conventional or other printed circuit board that may include various components, such as processors (e.g., general-purpose processors, application-specific integrated circuits), memory units, resistors, capacitors, inductors, potentiometers, transistors, diodes, and the like. As such, PCB 202 may include any components that perform any desired networking, computing or other task(s). Heat source 204 may correspond to any component of PCB 202 that generates heat, such as a processor. As shown, heat source 204 is centered in PCB 202 at a point at which heat sink base 206 makes contact. Accordingly, heat sink base 206 may be provided at a position that is in thermal conductivity with heat source 204, enabling heat to be conducted away from heat source 204 into heat sink surface 102 and then, into fins 104, whereupon the heat may be convected away from assembly 200.

In the depicted example, PCB 202 may be mounted to heat sink base 206 such that PCB 202 and its components are suspended inside of the internal cavity formed by enclosure 100. Thus, PCB 202 may be electrically grounded by avoiding contact with enclosure 100, which may be composed of a conducting material such as aluminum. PCB 202 may be mounted via one or more risers or a latch mechanism (not shown) that removably attaches PCB 202 to heat sink base 206 so that PCB 202 does not involve gravity to make contact with heat sink base 206 (e.g., so assembly 200 can be installed in a "fins-up" orientation).

Joint 208 may indicate where a first portion 210 of enclosure 100 joins a second portion 212 of enclosure 100. The two portions of enclosure 100 may be joined in a clamshell manner in which a first portion 210 of enclosure 100 is attached via a hinge to a second portion 212 of enclosure 100, and the two portions can be snapped together to form enclosure 100. In other embodiments, first portion 210 of enclosure 100 and second portion 212 of enclosure 100 are separate portions that snap together around the interior components (e.g., PCB 202). The first portion 210 and second portion 212 of enclosure 100 may be joined at joint 208 by a weld, such as a heat or sonic weld, or may be shaped such that one portion snaps over another portion. Various embodiments may include any conventional or other joining process used in computing and/or networking enclosures.

In one embodiment, the dimensions of enclosure 100 may be 150 mm in length, 150 mm in width, and 56.8 mm in height, including a fin height of 15 mm. In a same or other embodiment, PCB 202 may have dimensions of 100 mm by 105 mm by 1.6 mm, with a processor dimension of 30 mm by 30 mm by 2 mm, and a processor power consumption of 10 W.

Figure 5A:
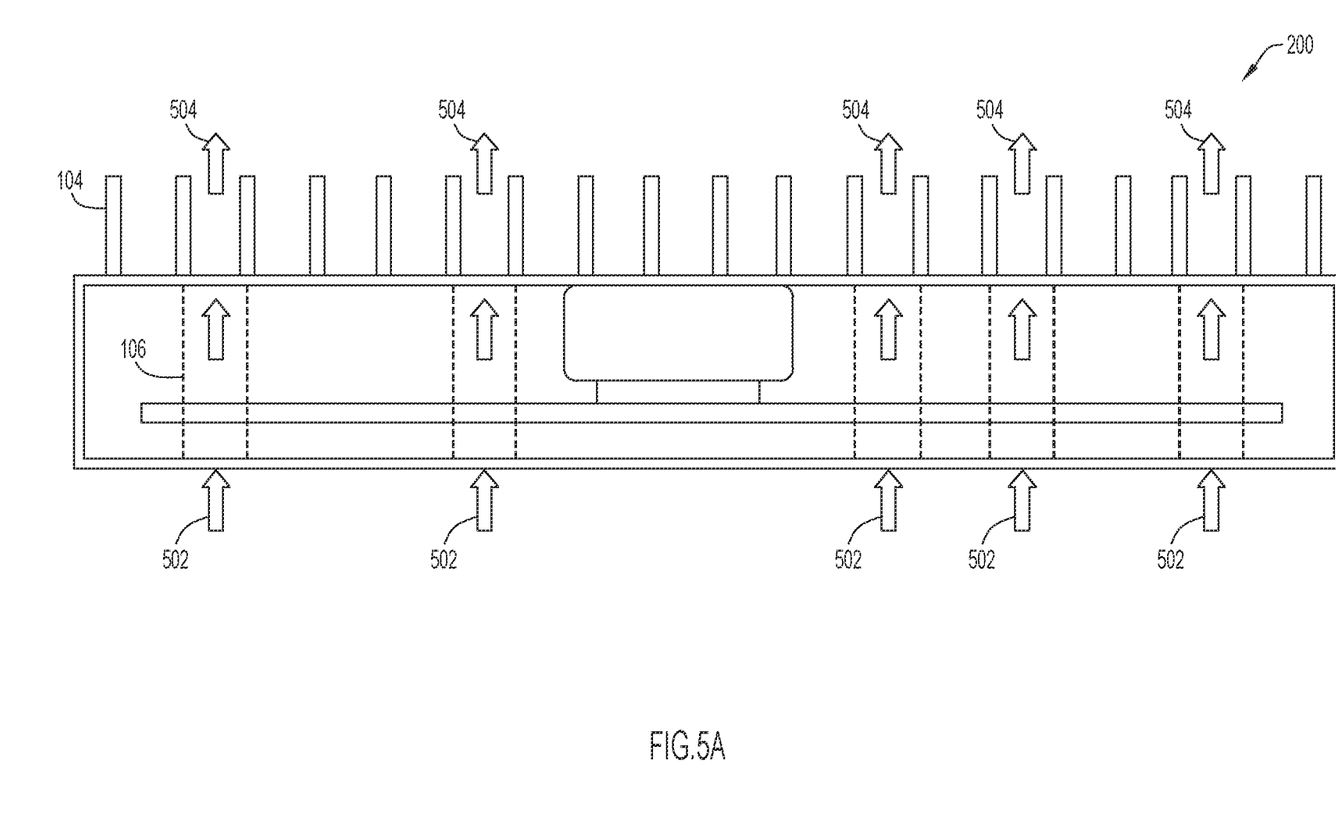
FIGS. 5A and 5B are schematic diagrams illustrating heat flow when a computing or networking device is installed in an enclosure various orientations, according to an example embodiment.
Figure 5B:
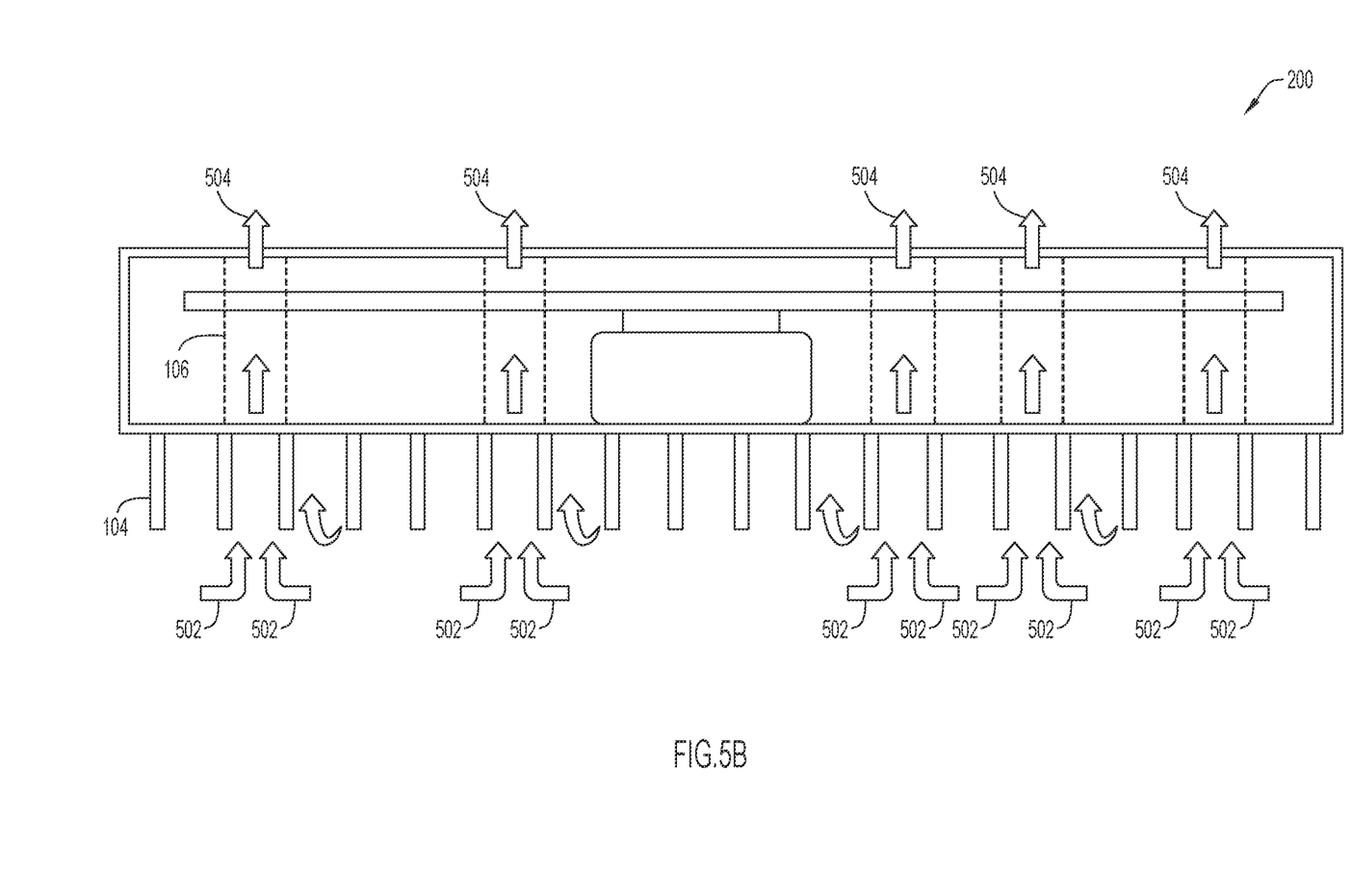

FIGS. 5A and 5B are schematic diagrams illustrating heat flow when a computing or networking device (e.g., assembly 200) is installed in an enclosure in various orientations, according to example embodiments. As shown in FIG. 5A, assembly 200 is installed in a "fins-up" orientation (e.g., the fins are extending in a direction that is substantially away from the force of gravity). The "fins-up" orientation may be appropriate when assembly 200 is installed on a surface, such as a table or countertop.

In the configuration depicted in FIG. 5A, warm air may rise away from the fins, as indicated by arrows 504. As the warm air rises, cool air (as indicated by arrows 502) may flow through channels 106 to occupy the lower-pressure areas created when the warm air rises away from assembly 200. Accordingly, the cooler air may be provided at fins 104 to be warmed, thereby cooling fins 104 enabling the internal components to be cooled via a combination of radiative, convective, and conductive heat transfer processes.

In contrast, as shown in FIG. 5B, assembly 200 is installed in a "fins-down" orientation (e.g., the fins are extending in a direction that is substantially toward the force of gravity). The "fins-down" orientation may be appropriate when assembly 200 is installed on the underside of a surface, such as mounted beneath a ceiling or under the top of a cabinet or similar space.

When a computing or networking device is mounted beneath a ceiling or the underside of a structure, warm air generated by operation of the device would cause a pocket of warm air to stagnate around the device, leading to overheating. In contrast, the channels 106 of assembly 200 enable cooler air (as indicated by arrows 502) to pass through assembly 200 after being warmed by fins 104, whereupon the now-warmer air rises out through channels 106 (as indicated by arrows 504). As the warm air cools and begins to descend, a circulatory current is induced in which air may continuously circulate through fins 104 of the heatsink, through channels 106, and out of the top of assembly 200. Thus, instead of creating a stagnant pocket of warm air, assembly 200 may be passively cooled.

Figure 6A:
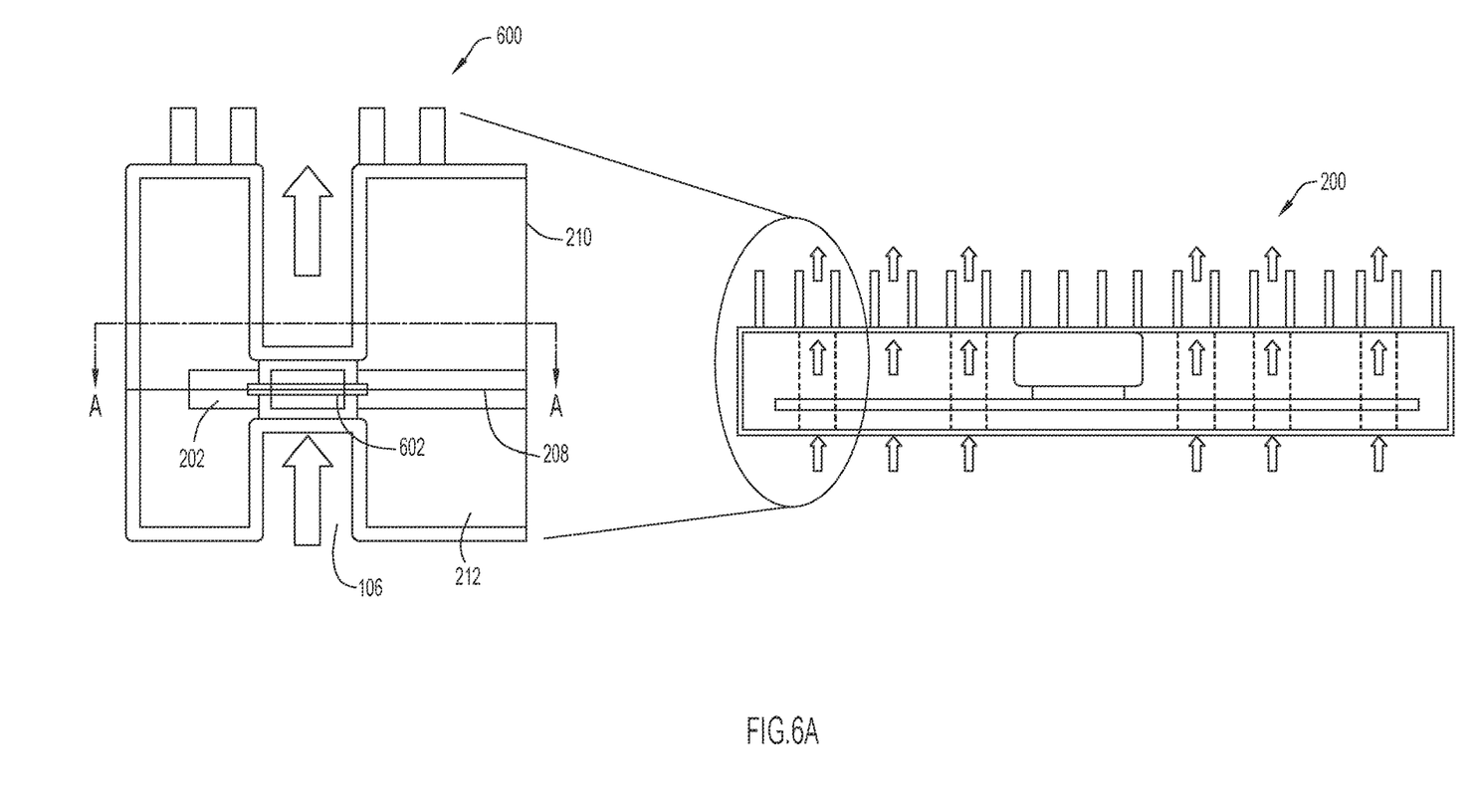
FIG. 6A illustrates a cutaway view of an assembly including an enclosure and internal components for a computing or networking device, including an enlarged view of a channel, according to an example embodiment.
Figure 6B:
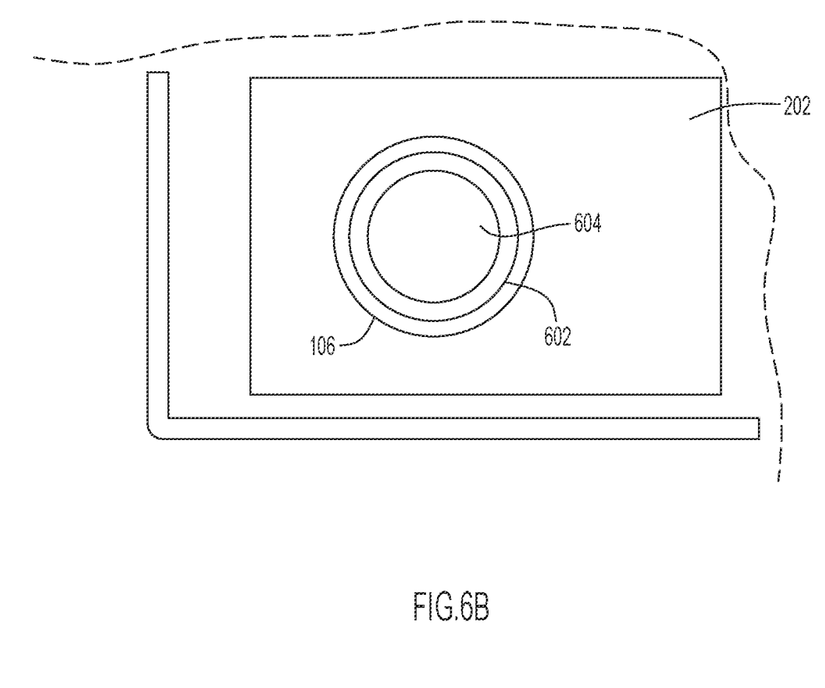
FIG. 6B is a view in section of the A-A' plane depicted in FIG. 6A.

FIG. 6A illustrates a cutaway view of an assembly 200 including an enclosure and internal components for a computing or networking device, including an enlarged view 600 of a channel 106, according to an example embodiment. As depicted in enlarged view 600, a single channel 106 is shown in cutout, including PCB 202 and a gasket 602. FIG. 6B is a view in section of the A-A' plane depicted in FIG. 6A; likewise, FIG. 6B depicts PCB 202, channel 106, and gasket 602. Additionally, FIG. 6B depicts a hole 604 in PCB 202 that enables channel 106 to pass through PCB 202.

Continuing with reference to both FIGS. 6A and 6B, gasket 602 may be placed at a position where the first portion 210 and second portions 212 of enclosure 100 meet (e.g., at joint 208). The walls of channel 106 may extend from the opening of channel 106 at the surface of each of the first and second portions of enclosure 100, and when the first and second portions of enclosure 100 are joined, their respective channel portions may align and mate, with gasket 602 inserted in between. Gasket 602 may prevent any leakage of fluid, dust, and/or electromagnetic radiation at the point of contact of the channel portions of the first and second portions of enclosure 100, thereby isolating the interior of enclosure 100 from the external environment. The channel portions of each of the first and second portions of enclosure 100 may each be formed as a die cast chassis.

In some embodiments, gasket 602, in combination with the sealing mechanism for enclosure 100, may provide a substantially waterproof environment for the interior of enclosure 100 at certain pressures. In some embodiments, gasket 602 is a shielding gasket that prevents electromagnetic waves from passing between the internal cavity of enclosure 100 and the external environment.

Figure 7:
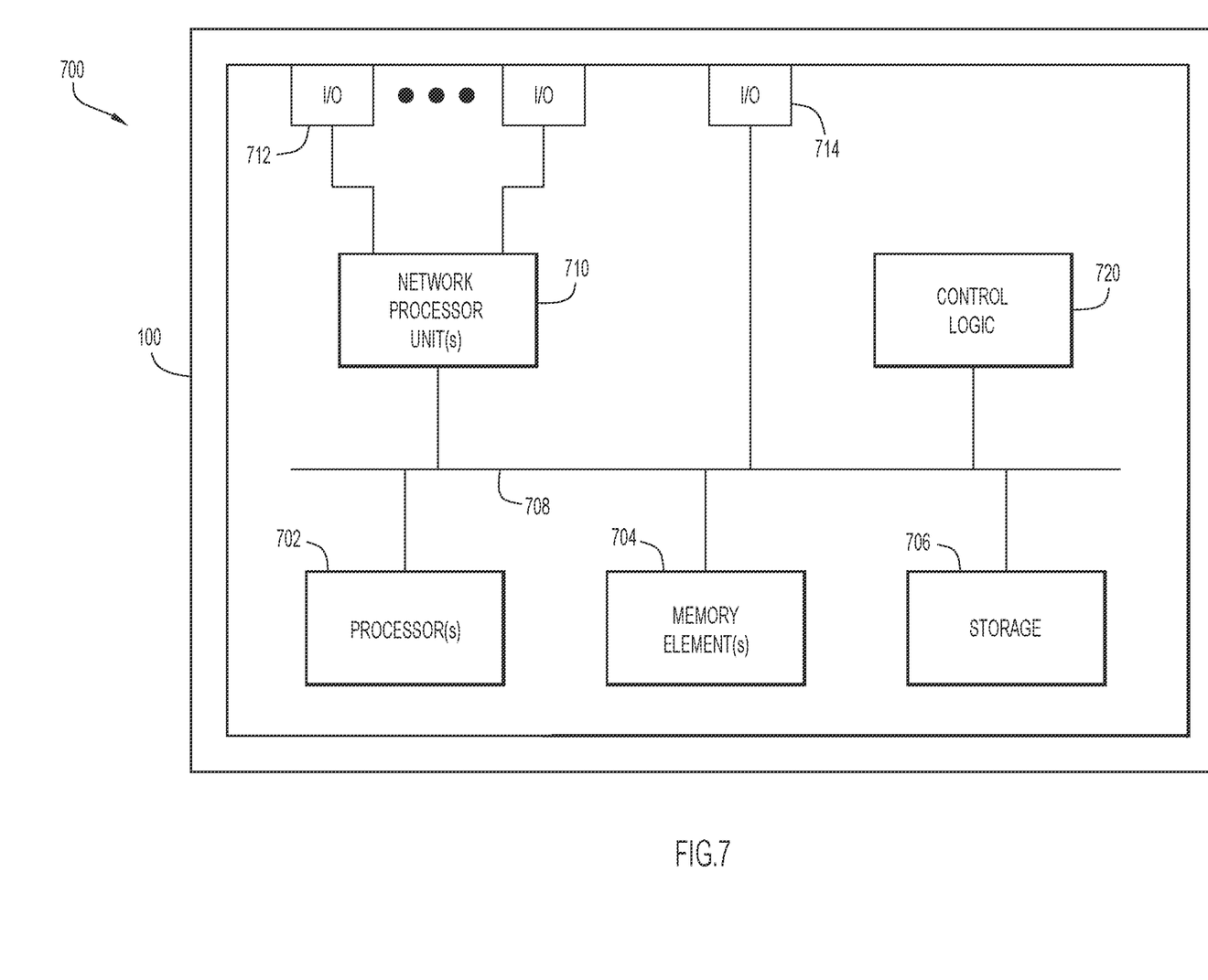
FIG. 7 is a block diagram of a device that may be configured to perform networking and/or computing tasks that may employ the cooling techniques in accordance with the embodiments presented herein.

Referring to FIG. 7, a block diagram is shown of a computing device 700 that may perform networking, computing or other tasks that may employ the cooling techniques in accordance with the embodiments presented herein in connection with FIGS. 1-6B. As depicted, computing device is provided inside of enclosure 100.

In at least one embodiment, the computing device 700 may include one or more processor(s) 702, one or more memory element(s) 704, storage 706, a bus 708, one or more network processor unit(s) 710 interconnected with one or more network input/output (I/O) interface(s) 712, one or more I/O interface(s) 714, and control logic 720. In various embodiments, instructions associated with logic for computing device 700 can overlap in any manner and are not limited to the specific allocation of instructions and/or operations described herein.

In at least one embodiment, processor(s) 702 is/are at least one hardware processor configured to execute various tasks, operations and/or functions for computing device 700 as described herein according to software and/or instructions configured for computing device 700. Processor(s) 702 (e.g., a hardware processor) can execute any type of instructions associated with data to achieve the operations detailed herein. In one example, processor(s) 702 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, memory element(s) 704 and/or storage 706 is/are configured to store data, information, software, and/or instructions associated with computing device 700, and/or logic configured for memory element(s) 704 and/or storage 706. For example, any logic described herein (e.g., control logic 720) can, in various embodiments, be stored for computing device 700 using any combination of memory element(s) 704 and/or storage 706. Note that in some embodiments, storage 706 can be consolidated with memory element(s) 704 (or vice versa), or can overlap/exist in any other suitable manner.

In at least one embodiment, bus 708 can be configured as an interface that enables one or more elements of computing device 700 to communicate in order to exchange information and/or data. Bus 708 can be implemented with any architecture designed for passing control, data and/or information between processors, memory elements/storage, peripheral devices, and/or any other hardware and/or software components that may be configured for computing device 700. In at least one embodiment, bus 708 may be implemented as a fast kernel-hosted interconnect, potentially using shared memory between processes (e.g., logic), which can enable efficient communication paths between the processes.

In various embodiments, network processor unit(s) 710 may enable communication between computing device 700 and other systems, entities, etc., via network I/O interface(s) 712 (wired and/or wireless) to facilitate operations discussed for various embodiments described herein. In various embodiments, network processor unit(s) 710 can be configured as a combination of hardware and/or software, such as one or more Ethernet driver(s) and/or controller(s) or interface cards, Fibre Channel (e.g., optical) driver(s) and/or controller(s), wireless receivers/transmitters/transceivers, baseband processor(s)/modem(s), and/or other similar network interface driver(s) and/or controller(s) now known or hereafter developed to enable communications between computing device 700 and other systems, entities, etc. to facilitate operations for various embodiments described herein. In various embodiments, network I/O interface(s) 712 can be configured as one or more Ethernet port(s), Fibre Channel ports, any other I/O port(s), and/or antenna(s)/antenna array(s) now known or hereafter developed. Thus, the network processor unit(s) 710 and/or network I/O interface(s) 712 may include suitable interfaces for receiving, transmitting, and/or otherwise communicating data and/or information in a network environment.

I/O interface(s) 714 allow for input and output of data and/or information with other entities that may be connected to computing device 700. For example, I/O interface(s) 714 may provide a connection to external devices such as a keyboard, keypad, mouse, a touch screen, and/or any other suitable input and/or output device now known or hereafter developed. In some instances, external devices can also include portable computer readable (non-transitory) storage media such as database systems, thumb drives, portable optical or magnetic disks, and memory cards. In still some instances, external devices can be a mechanism to display data to a user, such as, for example, a computer monitor, a display screen, or the like.

In various embodiments, control logic 720 can include instructions that, when executed, cause processor(s) 702 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

The programs described herein (e.g., control logic 720) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, entities as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, memory element(s) 704 and/or storage 706 can store data, software, code, instructions (e.g., processor instructions), logic, parameters, combinations thereof, and/or the like used for operations described herein. This includes memory element(s) 704 and/or storage 706 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable.

For example, a removable hard drive may be used for memory/storage in some implementations. Other examples may include optical and magnetic disks, thumb drives, and smart cards that can be inserted and/or otherwise connected to a computing device for transfer onto another computer readable storage medium.

Variations and Implementations

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 702.11 (e.g., Wi-Fi®/Wi-Fi6®), IEEE 702.16 (e.g., Worldwide Interoperability for Microwave Access (WiMAX)), Radio-Frequency Identification (RFID), Near Field Communication (NFC), Bluetooth™ mm.wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may directly or indirectly connected utilizing any algorithms, communication protocols, interfaces, etc. (proprietary and/or non-proprietary) that allow for the exchange of data and/or information.

Communications in a network environment can be referred to herein as 'messages', 'messaging', 'signaling', 'data', 'content', 'objects', 'requests', 'queries', 'responses', 'replies', etc. which may be inclusive of packets. As referred to herein and in the claims, the term 'packet' may be used in a generic sense to include packets, frames, segments, datagrams, and/or any other generic units that may be used to transmit communications in a network environment. Generally, a packet is a formatted unit of data that can contain control or routing information (e.g., source and destination address, source and destination port, etc.) and data, which is also sometimes referred to as a 'payload', 'data payload', and variations thereof. In some embodiments, control or routing information, management information, or the like can be included in packet fields, such as within header(s) and/or trailer(s) of packets. Internet Protocol (IP) addresses discussed herein and in the claims can include any IP version 4 (IPv4) and/or IP version 6 (IPv6) addresses.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of can be represented using the'(s)' nomenclature (e.g., one or more element(s)).

In one form, an apparatus is provided comprising a printed circuit board with at least one heat source, an enclosure around the printed circuit board, wherein the enclosure includes a first surface and a second surface opposite the first surface, and a heatsink comprising a body portion and a plurality of fins extending from the body portion, wherein the heatsink is attached to the first surface, and wherein the at least one heat source conducts heat to the heatsink, wherein a plurality of channels are provided between the first surface and the second surface, each of the plurality of channels passing through the enclosure, the heatsink, and the printed circuit board.

In another form, the first surface and the second surface of the enclosure are arranged to generate a temperature differential between them during operation of the apparatus.

In another form, the plurality of channels are arranged to cause fluid surrounding the apparatus to circulate through the plurality of channels during operation of the apparatus, which induces convection of the fluid surrounding the apparatus.

In another form, one or more of: the enclosure, and the heatsink, is comprised of an aluminum alloy.

In another form, the apparatus is configured to be mounted on an underside of a top surface of a space subject to a gravitational field, and the apparatus is configured to be mounted with the plurality of fins facing toward the gravitational field.

In another form, the plurality of channels are spaced more densely in a portion of apparatus that is closer to the at least one heat source.

In another form, the enclosure comprises a first portion and a second portion that are attachable to each other to form the enclosure, wherein the first portion comprises the first surface and a first segment of each of the plurality of channels, and wherein the second portion comprises the second surface and a second segment of each of the plurality of channels.

In another form, each of the first portion of the plurality of channels aligns with the second portion of the plurality of channels when the first portion and the second portion are joined to form the enclosure.

In another form, a gasket is positioned at each contact point of the first portion of plurality of channels and the second portion of plurality of channels.

In another form, wherein the at least one heat source comprises a processor.

In another form, an apparatus is provided comprising a printed circuit board with at least one heat source, and an enclosure around the printed circuit board, wherein the enclosure includes a first surface and a second surface opposite the first surface, wherein the first surface of the enclosure includes a heatsink on an external side of the first surface that is in thermal conductivity with the at least one heat source, wherein the printed circuit board is suspended in an internal cavity of the enclosure, and wherein a plurality of channels are provided between the first surface and the second surface, each of the plurality of channels passing through the enclosure, the heatsink, and the printed circuit board.

In another form, an apparatus is provided comprising: a printed circuit board with at least one heat source, an enclosure around the printed circuit board, wherein the enclosure includes a first surface and a second surface opposite the first surface, and a heatsink comprising a body portion and a plurality of fins extending from the body portion, wherein the heatsink is attached to the first surface, and wherein the at least one heat source conducts heat to the heatsink, wherein a plurality of channels are provided between the first surface and the second surface, each of the plurality of channels passing through the enclosure, the heatsink, and the printed circuit board, wherein the printed circuit board is suspended inside of the enclosure without the printed circuit board contacting an interior surface of the enclosure, and wherein operating the apparatus induces a fanless circulation of air through the plurality of channels.

In a further form, the first surface and the second surface of the enclosure are arranged to generate a temperature differential between them during operation of the apparatus, the temperature differential inducing the fanless circulation of air.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. An apparatus comprising:
    a printed circuit board with at least one heat source;
    an enclosure around the printed circuit board, wherein the enclosure includes a first surface and a second surface opposite the first surface; and
    a heatsink comprising a body portion and a plurality of fins extending from the body portion, wherein the heatsink is a separate portion that is attached to the first surface, and
    wherein the at least one heat source conducts heat to the heatsink, wherein a plurality of channels are provided between the second surface and the heatsink, a gasket positioned where the first surface and the second surface of the enclosure meet and a respective one of the channels passes through the gasket, and each of the plurality of channels passing through the second surface of the enclosure, the gasket, the printed circuit board, the first surface of the enclosure, and the heatsink, and
    wherein operating the apparatus induces a fanless circulation of a fluid independently through each of the plurality of channels.

2. The apparatus of claim 1, wherein the first surface and the second surface of the enclosure are arranged to generate a temperature differential between them during operation of the apparatus, the temperature differential inducing the fanless circulation of fluid.

3. The apparatus of claim 1, wherein the plurality of channels are arranged to cause fluid surrounding the apparatus to circulate through the plurality of channels during operation of the apparatus, which induces convection of the fluid surrounding the apparatus.

4. The apparatus of claim 1, wherein one or more of: the enclosure, and the heatsink, is comprised of an aluminum material.

5. The apparatus of claim 1, wherein the apparatus is configured to be mounted on an underside of a top surface of a space subject to a gravitational field, and the apparatus is configured to be mounted with the plurality of fins facing toward the gravitational field.

6. The apparatus of claim 1, wherein the plurality of channels are spaced more densely in a portion of apparatus that is closer to the at least one heat source.

7. The apparatus of claim 1, wherein the enclosure comprises a first portion and a second portion that are attachable to each other to form the enclosure, wherein the first portion comprises the first surface and a first segment of each of the plurality of channels, and wherein the second portion comprises the second surface and a second segment of each of the plurality of channels.

8. The apparatus of claim 7, wherein each of the first segment of the plurality of channels aligns with a respective one of the second segment of the plurality of channels when each first segment and the respective one of the second segment are joined to form the enclosure.

9. The apparatus of claim 1, wherein the at least one heat source comprises a processor.

10. An apparatus comprising:
a printed circuit board with at least one heat source; and
an enclosure around the printed circuit board, wherein the enclosure includes a first surface and a second surface opposite the first surface;
wherein the first surface of the enclosure includes a heatsink
on an external side of the first surface that is in thermal conductivity with the at least one heat source;
wherein the printed circuit board is suspended in an internal cavity of the enclosure;
wherein a plurality of channels are provided between the first surface and the second surface, a gasket positioned where the first surface and the second surface of the enclosure meet and a respective one of the channels passes through the gasket, and each of the plurality of channels passing through the second surface of the enclosure, the gasket, the printed circuit board, and the heatsink of the first surface of the enclosure, and
wherein operating the apparatus induces a fanless circulation of a fluid independently through each of the plurality of channels.

11. The apparatus of claim 10, wherein the first surface and the second surface of the enclosure are arranged to generate a temperature differential between them during operation of the apparatus.

12. The apparatus of claim 10, wherein the plurality of channels are arranged to cause the fluid surrounding the apparatus to circulate through the plurality of channels during operation of the apparatus, which induces convection of the fluid surrounding the apparatus.

13. The apparatus of claim 10, wherein one or more of: the enclosure, and the heatsink, is comprised of an aluminum material.

14. The apparatus of claim 10, wherein the apparatus is configured to be mounted on an underside of a top surface of a space subject to a gravitational field, and the apparatus is configured to be mounted with the first surface facing toward the gravitational field.

15. The apparatus of claim 10, wherein the plurality of channels are spaced more densely in a portion of apparatus that is closer to the at least one heat source.

16. An apparatus comprising:
a printed circuit board with at least one heat source;
an enclosure around the printed circuit board, wherein the enclosure includes a first surface and a second surface opposite the first surface; and
a heatsink comprising a body portion and a plurality of fins extending from the body portion, wherein the heatsink is a separate portion that is attached to the first surface, and wherein the at least one heat source conducts heat to the heatsink,
wherein a plurality of channels are provided between the second surface and the heatsink, a gasket positioned where the first surface and the second surface of the enclosure meet and a respective one of the channels passes through the gasket, and each of the plurality of channels passing through the second surface of the enclosure, the gasket, the printed circuit board, the first surface of the enclosure, and the heatsink;
wherein the printed circuit board is suspended inside of the enclosure by the gasket without the printed circuit board contacting an interior surface of the enclosure; and
wherein operating the apparatus induces a fanless circulation of a fluid independently through each of the plurality of channels.

17. The apparatus of claim 16, wherein the first surface and the second surface of the enclosure are arranged to generate a temperature differential between them during operation of the apparatus, the temperature differential inducing the fanless circulation of the fluid.

18. The apparatus of claim 16, wherein the apparatus is configured to be mounted on an underside of a top surface of a space subject to a gravitational field, and the apparatus is configured to be mounted with the plurality of fins facing toward the gravitational field.

19. The apparatus of claim 16, wherein the plurality of channels are spaced more densely in a portion of apparatus that is closer to the at least one heat source.

20. The apparatus of claim 16, wherein the at least one heat source comprises a processor.

* * * * *